United States Patent [19]

Dietl et al.

[11] 4,304,763

[45] Dec. 8, 1981

[54] PROCESS FOR PURIFYING METALLURGICAL-GRADE SILICON

[75] Inventors: Josef Dietl, Neuötting; Michael Wohlschläger, Unterpfaffenhofen, both of Fed. Rep. of Germany

[73] Assignee: Consortium fur Elektrochemische Industrie GmbH, Munich, Fed. Rep. of Germany

[21] Appl. No.: 176,745

[22] Filed: Aug. 11, 1980

[30] Foreign Application Priority Data

Aug. 16, 1979 [DE] Fed. Rep. of Germany ....... 2933164

[51] Int. Cl.³ .............................................. C01B 33/02
[52] U.S. Cl. .................................................... 423/348
[58] Field of Search ................................. 423/348–350

[56] References Cited

U.S. PATENT DOCUMENTS

| | | | |
|---|---|---|---|
| 2,992,080 | 7/1961 | Herrick | 423/348 X |
| 3,004,835 | 10/1961 | Verner et al. | 423/348 |
| 3,442,662 | 5/1969 | Monnier et al. | 423/348 |

FOREIGN PATENT DOCUMENTS 907855 10/1962 United Kingdom ................ 423/348

OTHER PUBLICATIONS

Chem. Abst.; vol. 80; 42098y; 1974.

Primary Examiner—G. O. Peters
Attorney, Agent, or Firm—Allison C. Collard; Thomas M. Galgano

[57] ABSTRACT

A process is provided for purifying metallurgical-grade silicon for the manufacture of solar cells, wherein the acid treatment of the silicon, known per se, is combined with vacuum evaporation. This may be optionally combined with slag extraction and directional solidification.

11 Claims, No Drawings

PROCESS FOR PURIFYING METALLURGICAL-GRADE SILICON

The present invention relates to a process for purifying metallurgical-grade silicon for the manufacture of solar cells by leaching with an acid solution.

The invention is to be viewed primarily in the context of energy production by means of silicon solar cells. In order for the supply of electrical energy by such solar cells to be economically competitive, the silicon base material must be made available relatively inexpensively. The silicon, which is found in the earth in the form of $SiO_2$ in practically inexhaustible quantities, must, however, first be reduced and purified. The purification of metallurgical-grade silicon via the gas phase, as is usual in the manufacture of high-grade electronic components, must be excluded from consideration because it is far too expensive. However, not such great demands are made on the purity of solar cell silicon and, therefore, cheaper purification processes can be used. A known process for purifying metallurgical-grade silicon involves, for example, treatment with acids or acid combinations (cf., for example, Swiss Pat. No. 567,435, U.S. Pat. No. 2,972,521, and L. P. Hunt et al. "Purification of metallurgical-grade silicon to solar-grade quality", Solar Energy, Proc. Internat. Symposium 1976). These processes, however, provide only grades of purity that are either insufficient for the manufacture of solar cells or require extremely long processing times.

European patent application No. 2,135 describes a process for purifying metallurgical-grade silicon according to which silicon is placed in a metal smelt, crystallized from that smelt, treated with an extraction melt and then purified by pulling from the melt with the impurities remaining in the melt. The introductory portion of this patent application also describes numerous other literature references that deal with the cheap purification of metallurgical-grade silicon.

Finally, German Offenlegungsschrift No. 27 29 464 describes a process for purifying silicon, according to which, prior to the chemical purification step known per se, the silicon is melted and then solidified again by slow cooling, it being possible optionally to bring the silicon melt into contact with an extraction melt as well.

The problem underlying the invention was to find a purification process for metallurgical-grade silicon which, compared with the mentioned prior art, results in increased purity at comparatively lower cost and with acceptable processing times.

This problem is solved by a process according to the present invention which is characterized in that the chemical purification step known per se is combined with vacuum evaporation at 1500° to 1700° C. under a pressure of from $10^{-6}$ to $10^{-4}$ bar.

Although L. P. Hunt et al. (Dow Corning Corp. Quart. Report No. 2 ERDA/JPL/954559-76 Jan. 2, 1977) have already attempted to subject silicon to a vacuum treatment for the purpose of purification, these authors were not able to achieve the slightest purifying effect so that, in principle, they advised against a purification process of this type.

According to the process of the invention, metallurgical-grade silicon, which should be understood as meaning silicon having a silicon content of more than 95% by weight, is advantageously comminuted, preferably to a particle size within the range of from 20 to 60 μm (fine dust below 20 μm constituting less than 5% by weight) and an aqueous acid solution is added thereto.

Suitable acids are especially aqueous hydrochloric acid and aqueous hydrofluoric acid alone or, especially, in admixture and advantageously in a molar ratio of approximately 3:1 to 1:2. The hydrochloric acid is advantageously used as a 5 to 20% by volume aqueous acid and the hydrofluoric acid as a 2.5 to 10% by volume aqueous acid, it of course being possible, in the case of mixtures of the two aqueous acids, for other contents to result calculated on the water content of the mixture.

It has proved advantageous to add approximately 1 to 10 liters of acid mixture to approximately 1 kg of metallurgical-grade silicon. The duration of the treatment depends on the temperature and is, for example, from 4 to 48 hours at 20° C. and is reduced to approximately from 1 to 24 hours at 80° C. During treatment, used acid can optionally be removed partially or completely and replaced by fresh acid or a fresh component of the mixture. After this treatment time, the acid is centrifuged off and the powder is washed until free of acid. According to the preferred method of carrying out the process, the powder pre-purified in this manner is then melted down and subjected to vacuum evaporation although, in principle, the acid treatment can follow the vacuum process. The first-mentioned method is, however, generally more favorable since the silicon, which is present in liquid form after the vacuum treatment, can then be cast immediately—or optionally after additional doping—to form solar cell plates.

The silicon powder formed after the acid treatment is melted down under a protective gas, for example, argon, nitrogen or mixtures thereof, under normal pressure or slightly reduced pressure—to approximately 0.3 bar. The pressure is then reduced slowly, since otherwise the silicon melt often begins to gas vigorously as a result of the impurities it contains.

Suitable crucible materials are, for example, graphite, silicon carbide or silicon nitride that have a high density or are coated with a pore-free substance. Melt depths of up to approximately 30 cm are advantageous. If the melt is stirred, for example, with graphite stirrers—optionally coated with a protective melt of calcium silicate/calcium fluoride—or by inductive stirring in the medium frequency range, then it is of course possible to cope with greater melt depths.

The silicon melt is evaporated after reaching a low pressure of approximately $10^{-6}$ to $10^{-4}$ bar, advantageously over a period of approximately 0.5 to 2 hours.

Subsequently, the silicon purified in this manner can be cast directly to form a solar cell base material in the form of small wafers or blocks, for example, according to the process of German Auslegeschrift No. 25 08 803.

Further purification can be achieved by subjecting the molten silicon to directional solidification, for example, according to the known "Czochralski process" (cf. W. R. Runyan "Silicon Semiconductor Technology", pp. 34–39, McGraw-Hill, 1965), in which a silicon rod is pulled from the melt, and when monocrystalline growth is desired, a monocrystal is lowered into the surface of the melt and the silicon crystallizing out grows in the form of a rod on this monocrystal while it is being rotated. Since monocrystalline growth is not, however, absolutely necessary for solar cell material, it is possible to use higher pulling speeds up to a maximum of approximately 100 mm/h, advantageously between approximately 50 and 75 mm/h, which gives a further-purified coarsely crystalline material. The last portion of the melt (approximately 10% by volume) to be solidified is advantageously returned to the starting metallurgical-grade silicon, since the impurities accumulate in this portion.

It is especially advantageous to lower the entire crucible slowly out of the heating zone after vacuum evaporation since, in this case too, coarse-grained purified silicon that has solidified under controlled conditions results. In this case, depending on the size of the charge, it is advantageous to operate at lowering speeds of approximately 20 to 40 mm/h. In this process variant as well, the impurities accumulate in the portion that solidifies last and this must therefore be separated and added to the starting material again or be discarded. In the case of solidification under controlled conditions by lowering the heating crucible, it may be advantageous to carry out the acid treatment, not as the first step after or during grinding of the silicon, but subsequent to solidification since the impurities are already partially precipitated in the case of directional solidification and are thus subjected to acid attack in an exposed condition.

If the metallurgical-grade silicon to be purified has a high boron content, which, in the case of solar cell base material, is understood as meaning boron contents of greater than approximately 10 ppm, then it is advantageous to bring the molten silicon into contact with an extraction melt as well. This possibly necessary treatment with an extraction melt is advantageously carried out as the first step and the resolidified silicon is subsequently comminuted, treated with acid, melted down again and purified by vacuum evaporation. Suitable extraction melts are those that consist of alkaline earth metal silicates, e.g., calcium or magnesium silicate, or alkaline earth metal fluorides, such as, e.g., calcium fluoride and magnesium fluoride, and mixed melts, consisting of, e.g., calcium fluoride and calcium silicate, magnesium fluoride and magnesium silicate, and calcium silicate and magnesium silicate (cf., e.g., German Pat. No. 10 22 806 and U.S. Pat. No. 3,871,872). Particularly good results can be obtained with the preferred mixed melt of calcium fluoride and 30 to 70% by weight (calculated on mixed melt) of calcium silicate under an oxidizing atmosphere.

The extraction time is advantageously approximately 0.5 to 1 hour and the temperature approximately 1450° to 1600° C. The quantitative ratio of extraction melt to silicon is advantageously within the range of from 1:3 to 10:1.

In the following examples, the process of the present invention will be more fully described, and are given by way of illustration and not of limitation.

EXAMPLE 1

Metallurgical-grade silicon having a boron content of 8 ppm by weight was subjected to preliminary comminution with a jaw crusher and ground in a vibration grinding mill to a powder having an average particle size within the range of from 20 to 60 μm. 5 kg of the metallurgical-grade silicon powder were leached for 10 hours at 80° C., while stirring, with an acid mixture of 5 liters of 20% by weight aqueous hydrochloric acid and 5 liters of 10% by weight aqueous hydrofluoric acid. The powder was then washed until free of acid in a washing centrifuge, and dried. The powder was then melted in an inductively heated vacuum melting apparatus under an inert gas atmosphere of 0.65 bar argon and the melt was maintained at 1600° C. During this operation, the melt was in a graphite crucible, having an internal diameter of 15 cm, with a melt depth of 12 cm. By slowly lowering the pressure over a period of 30 minutes, a vacuum of $5 \cdot 10^{-5}$ bar was achieved. Vacuum evaporation lasted approximately 1 hour and was aided by stirring the melt with a graphite stirrer.

The silicon melt was then cast under the influence of a temperature gradient to form ingots having a columnar structure suitable for solar cell use. The ingots were then sawn up and the small wafers were processed to form solar cells having boron doping. The effect of the purification process according to the invention by acid treatment and subsequent vacuum evaporation is shown in Table 1.

EXAMPLE 2

Metallurgical-grade silicon having a boron content of 8 ppm by weight was comminuted as in Example 1, ground, etched with acid, and subjected to vacuum treatment. The silicon melt was then solidified under controlled conditions by lowering the graphite crucible out of the heating zone at a speed of 25 mm/h. The crystal structure formed in this way had large columnarly-arranged grains. The purity of the half of the silicon solidified first is shown in Table 1. Small wafers were sawn from this silicon and processed to form solar cells having boron doping.

TABLE 1

| | Purity data in ppm by weight | | |
|---|---|---|---|
| Element | Metallurgical-grade silicon | Example 1 | Example 2 |
| Fe | 3500 | 1.5 | 0.2 |
| Al | 1200 | <1 | <0.2 |
| Ca | 1500 | <1 | <0.5 |
| Mn | 300 | <0.5 | <0.1 |
| Ti | 300 | 0.5 | <0.1 |
| Cr | 40 | <1 | <0.1 |
| Cu | 40 | <0.5 | <0.1 |
| B | 8 | 8 | 7 |
| P | 30 | <1 | <1 |

EXAMPLE 3

5 kg of metallurgical-grade silicon having a boron content of 30 ppm by weight were melted together with an extraction melt of technical purity consisting of 4 kg $CaF_2 + 3$ kg $CaO + 3$ kg $SiO_2$ in an inductively heated graphite crucible, and maintained in melt contact for approximately 30 minutes at temperatures of between 1450° and 1500° C. This melt extraction took place in an oxidizing atmosphere (air); (the operation may alternatively be effected under nitrogen in order to reduce crucible loss due to burning). After the extraction period, the silicon was separated from the calcium fluoride/calcium silicate melt by pouring off and slowly solidified in a graphite chill mold. The further purification was then carried out in the same manner as in Example 1 with acid and vacuum treatment. The silicon melt was then cast into ingots. These were sawn into small wafers and solar cells were produced therefrom. The purity obtained compared with the original impurity contents is given in Table 2.

TABLE 2

| | Purity data in ppm by weight | |
|---|---|---|
| Element | Metallurgical-grade silicon | Example 3 |
| Fe | 3000 | 1 |
| Al | 1500 | <1 |

TABLE 2-continued

| | Purity data in ppm by weight | |
|---|---|---|
| Element | Metallurgical-grade silicon | Example 3 |
| Ca | 1500 | <1 |
| Mn | 300 | <0.5 |
| Ti | 300 | 0.5 |
| Cr | 40 | <1 |
| Cu | 40 | <0.5 |
| B | 30 | 8 |
| P | 30 | <1 |

Thus, while only several examples of the present invention have been described, it will be obvious that many changes and modifications can be made in carrying out the present invention without departing from the spirit and scope thereof.

What is claimed is:

1. In a process for purifying metallurgical-grade silicon for the manufacture of solar cells by leaching with an acid solution, the improvement comprising the steps of:
    combining said chemical purification step of leaching with an acid solution which is known per se with vacuum evaporation at 1500° to 1700° C. under a pressure of from $10^{-6}$ to $10^{-4}$ bar.

2. The process according to claim 1, wherein said vacuum evaporation step follows the leaching with acid.

3. The process according to claim 1 or 2, additionally including the step of comminuting the metallurgical-grade silicon to be purified to a particle size of 20 to 60 μm.

4. The process according to claim 1, wherein a mixture of aqueous hydrochloric acid and aqueous hydrofluoric acid is used as said acid solution.

5. The process according to claim 1, wherein 1 to 10 liters of acid solution are added per kg of silicon to be purified.

6. The process according to claim 1, additionally including the step of subjecting the purified silicon to directional solidification.

7. The process according to claim 6, wherein said step of subjecting said purified silicon to directional solidification is carried out by melting said silicon in a crucible disposed in a heating zone and lowering the crucible out of the heating zone at a speed of 20 to 40 mm per hour.

8. The process according to claim 1, wherein metallurgical-grade silicon having a high boron content of greater than approximately 10 ppm is employed which is initially melted down and brought into contact with an extraction melt.

9. The process according to claim 8, wherein said extraction melt comprises a mixed melt of calcium fluoride and calcium silicate.

10. A process for purifying metallurgical grade silicon for the manufacture of solar cells, comprising the steps of:
    (a) subjecting said metallurgical grade silicon to a single chemical purification operation by leaching with an acid solution selected from the group consisting of aqueous hydrocloric acid, aqueous hydrofluoric acid and an admixture thereof;
    (b) subjecting said metallurgical grade silicon to a single vacuum evaporation operation at 1500° to 1700° C. under a pressure of from $10^{-6}$ to $10^{-4}$ bar for a period of about 0.5 to 2 hours; and
    (c) following steps (a) and (b) directly recovering solar cell grade silicon.

11. The process according to claim 10 wherein step (a) is performed for a period between 1 and 48 hours at a temperature of between 20° and 80° C.

* * * * *